US012426416B2

(12) United States Patent
Cheng (10) Patent No.: US 12,426,416 B2
(45) Date of Patent: Sep. 23, 2025

(54) DISPLAY PANEL (71) Applicant: TCL China Star Optoelectronics Technology Co., Ltd., Shenzhen (CN)

(72) Inventor: Xi Cheng, Shenzhen (CN)

(73) Assignee: TCL China Star Optoelectronics Technology Co., Ltd, Shenzhen (CN)

( * ) Notice: Subject to any disclaimer, the term of this patent is extended or adjusted under 35 U.S.C. 154(b) by 50 days.

(21) Appl. No.: 17/437,431

(22) PCT Filed: Jun. 18, 2021

(86) PCT No.: PCT/CN2021/100938
§ 371 (c)(1),
(2) Date: Sep. 9, 2021

(87) PCT Pub. No.: WO2022/222258
PCT Pub. Date: Oct. 27, 2022

(65) Prior Publication Data
US 2024/0038945 A1 Feb. 1, 2024

(30) Foreign Application Priority Data
Apr. 21, 2021 (CN) .......................... 202110429420.1

(51) Int. Cl.
H10H 20/856 (2025.01)
H01L 25/075 (2006.01)

(52) U.S. Cl.
CPC ....... *H10H 20/856* (2025.01); *H01L 25/0753* (2013.01)

(58) Field of Classification Search
CPC .......................... H10H 20/856; H10H 20/841; H01L 25/0753; H01L 25/167; G09F 9/33
See application file for complete search history.

(56) References Cited

U.S. PATENT DOCUMENTS 9,806,127 B1 * 10/2017 Ahmed ............ H10H 20/01335
10,401,556 B2 * 9/2019 Lee ..................... H10H 20/8514
(Continued)

FOREIGN PATENT DOCUMENTS

CN 1218996 A 6/1999
CN 104369440 A 2/2015
(Continued)

OTHER PUBLICATIONS

International Search Report in International application No. PCT/CN2021/100938, mailed on Jan. 19, 2022.
(Continued)

Primary Examiner — Victor A Mandala
(74) Attorney, Agent, or Firm — Nathan & Associates; Menachem Nathan (57) ABSTRACT The present application discloses a display panel. The display panel includes a plurality of light emitting devices distributed in an array, wherein each light-emitting device includes an upper light emitting surface and a side light emitting surface configured to transmit light, and wherein the side light emitting surface is provided with a reflective layer; a plurality of light emitting devices includes a plurality of light emitting devices with different colors, and the reflective layer on the light emitting device with one color is configured to reflect light emitted by the color light emitting devices with another colors.

17 Claims, 5 Drawing Sheets

(56) References Cited

U.S. PATENT DOCUMENTS

| | | | |
|---|---|---|---|
| 10,516,081 B1* | 12/2019 | Xin | H10H 20/821 |
| 10,693,049 B2* | 6/2020 | Moon | H10H 20/8512 |
| 11,380,821 B2* | 7/2022 | Jia | H10H 20/841 |
| 2008/0101072 A1* | 5/2008 | Ohta | H05B 33/24 |
| | | | 362/296.07 |
| 2018/0040665 A1* | 2/2018 | Ohmae | H10D 64/20 |
| 2018/0062047 A1* | 3/2018 | Biwa | H10H 20/831 |
| 2018/0198046 A1* | 7/2018 | Hwang | H10H 20/856 |
| 2018/0358520 A1* | 12/2018 | Moon | H10H 20/8512 |
| 2019/0035974 A1* | 1/2019 | Li | G09G 3/32 |
| 2020/0176655 A1* | 6/2020 | Iguchi | H10H 20/8312 |
| 2020/0212267 A1* | 7/2020 | Kwak | H10H 20/8514 |
| 2020/0219930 A1* | 7/2020 | Chen | H10H 20/841 |
| 2021/0020619 A1* | 1/2021 | Iguchi | H10H 20/835 |
| 2021/0151422 A1* | 5/2021 | Iguchi | H01L 25/167 |
| 2022/0059740 A1* | 2/2022 | Hahn | H01L 25/18 |
| 2022/0181526 A1* | 6/2022 | Bohmer | H01L 25/0753 |
| 2022/0262853 A1* | 8/2022 | Yamada | H10H 20/01 |
| 2022/0285581 A1* | 9/2022 | Hong | H10H 20/8312 |

FOREIGN PATENT DOCUMENTS

| | | |
|---|---|---|
| CN | 105026963 A | 11/2015 |
| CN | 208189120 U | 12/2018 |
| CN | 109256456 A | 1/2019 |
| CN | 109904295 A | 6/2019 |
| CN | 110061045 A | 7/2019 |
| CN | 110824598 A | 2/2020 |
| CN | 111403371 A | 7/2020 |
| CN | 211404520 U | 9/2020 |
| CN | 112151567 A | 12/2020 |
| CN | 112582441 A | 3/2021 |
| KR | 20130019070 A | 2/2013 |

OTHER PUBLICATIONS

Written Opinion of the International Search Authority in International application No. PCT/CN2021/100938, mailed on Jan. 19, 2022.

Chinese Office Action issued in corresponding Chinese Patent Application No. 202110429420.1 dated Apr. 15, 2022, pp. 1-9.

Chinese Office Action issued in corresponding Chinese Patent Application No. 202110429420.1 dated Nov. 14, 2022, pp. 1-9.

Chinese Office Action issued in corresponding Chinese Patent Application No. 202110429420.1 dated Mar. 22, 2023, pp. 1-6.

* cited by examiner

DISPLAY PANEL

FIELD OF INVENTION

The present application relates to a field of display technology and more particularly to a display panel.

BACKGROUND OF INVENTION

As display devices have greater and greater demands for image quality, improving display image quality has become a new requirement for display devices. As a brand-new display technology, mini-LED/micro-LED has advantages over OLED in terms of brightness and power consumption, and has become a popular direction in the display field.

However, mini-LED/micro-LED chips are becoming smaller and smaller, and the top and sides of the LED can emit light. The side light of the LED illuminates the adjacent LED, which is easy to cause light mixing between adjacent LEDs with different colors, which affects display effect.

SUMMARY OF INVENTION

The embodiment of the present application provides a display panel, which can prevent light mixing between adjacent light emitting devices with different colors and improve the display effect.

One embodiment of the present application provides a display panel including a plurality of light emitting devices distributed in an array, wherein each light emitting device includes an upper light emitting surface and a side light emitting surface configured to transmit light, and wherein the side light emitting surface is provided with a reflective layer;

wherein the plurality of light emitting devices includes a plurality of light emitting devices with different colors, and wherein the reflective layer on the light emitting device with one color is configured to reflect light emitted by the color light emitting devices with another colors.

Optionally, the side light emitting surface includes at least one first sub-light-emitting surface provided adjacent to another light emitting device; and the reflective layer is provided on the at least one first sub-light-emitting surface of the side light emitting surface Optionally, the side light emitting surface includes at least one second sub-light-emitting surface provided adjacent to the light emitting device with another color; and the reflective layer is provided on the at least one second sub-light-emitting surface of the side light emitting surface.

Optionally, the reflective layer comprises a plurality of reflective films laminated on the side light emitting surface; and the refractive indexes of any two adjacent reflective films are different.

Optionally, the refractive indexes of the plurality of reflective films are all different.

Optionally, a material, a thickness, and a number of reflective films of the reflective layer on the light emitting devices with different colors are different.

Optionally, a material of each reflective film comprises any one of a silicon nitride, a silicon oxide, or an amorphous silicon.

Optionally, the plurality of light emitting devices with different colors includes a first color light emitting device, a second color light emitting device, and a third color light emitting device;

a side light emitting surface of the first color light emitting device includes at least one third sub-light-emitting surface and at least one fourth sub-light-emitting surface; and the at least one third sub-light-emitting surface is provided adjacent to the second color light emitting device, and the at least one fourth sub-light-emitting surface is provided adjacent to the third color light emitting device.

Optionally, the reflective layer on the first color light emitting device includes a first sub-reflective layer and a second sub-reflective layer;

the first sub-reflective layer is provided on the at least one third sub-light-emitting surface, and is configured to reflect the light emitted from the second color light emitting device; and the second sub-reflective layer is provided on the at least one fourth sub-light-emitting surface, and is configured to reflect the light emitted from the third color light emitting device.

Optionally, the first sub-reflective layer includes a plurality of first sub-reflective films laminated on the third sub-light-emitting surface, and the second sub-reflective layer comprises a plurality of second sub-reflective films laminated on the fourth sub-light-emitting surface; and the refractive indexes of any two adjacent first sub-reflective films are different, and the refractive indexes of any two adjacent second sub-reflective films are different.

Optionally, the refractive indexes of the plurality of first sub-reflective films are all different.

Optionally, the refractive indexes of the plurality of second sub-reflective films are all different.

Optionally, the first sub-reflective layer and the second sub-reflective layer are different in material, thickness, and number of sub-reflective films.

Optionally, the display panel further includes an array substrate and a plurality of light shielding layers;

wherein the plurality of light emitting devices are positioned on the array substrate, and wherein the plurality of light shielding layers are positioned on the array substrate between any adjacent light emitting devices with different colors.

Optionally, a material of the light shielding layers is ink.

Optionally, the multiple-color light-emitting device includes a red light-emitting device, a blue light-emitting device, and a green light-emitting device.

The beneficial effects of the present application are as follows: the display panel includes a plurality of light emitting devices distributed in an array, wherein each light emitting device includes an upper light emitting surface and a side light emitting surface, the side light emitting surface is provided with a reflective layer, wherein the plurality of light emitting devices includes a plurality of light emitting devices with different colors, and wherein the reflective layer on the light emitting device with one color is configured to reflect the light emitted by the color light emitting devices with another colors, to prevent light mixing between adjacent light-emitting devices with different colors, thereby improving the display effect.

DESCRIPTION OF FIGURES

The following detailed description of specific embodiments of the present application in conjunction with the accompanying figures will make the technical solutions and other beneficial effects of the present application obvious.

DETAILED DESCRIPTION OF EMBODIMENTS

The specific structure and functional details disclosed herein are only representative, and are used for the purpose of describing exemplary embodiments of the present application. However, the present application can be implemented in many alternative forms, and should not be construed as being limited only to the embodiments described herein.

In the description of the present application, it should be understood that the terms "center", "lateral", "upper", "lower", "left", "right", "vertical", "horizontal", "top", "bottom", and "inner" and other directions or positional relationship is based on orientation or positional relationship shown in the figures, and is only for the convenience of describing the present application and simplifying the description, and does not indicate or imply that the device or element referred to must have a specific orientation, be constructed and operated in a specific orientation, therefore, it cannot be understood as a restriction on the present application. In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present application, "plurality" means two or more than two, unless otherwise specifically defined. In addition, the term "including" and any variations thereof is intended to cover non-exclusive inclusion.

In the description of the present application, it should be noted that, unless otherwise clearly specified and limited, the terms "installation", "link", and "connection" should be understood in a broad sense, for example, it can be a fixed connection or a detachable connection, or integrally connected; it can be a mechanical connection or an electrical connection; it can be directly connected or indirectly connected through an intermediate medium, and it can be an internal communication between two components. For those of ordinary skill in the art, the specific meaning of the above-mentioned terms in the present application can be understood under specific circumstances.

The terms used herein are only for describing specific embodiments and are not intended to limit the exemplary embodiments. Unless the context clearly dictates otherwise, the singular forms "a" and "one" used herein are also intended to include the plural. It should also be understood that the terms "including" and/or "comprising" used herein specify the existence of the stated features, integers, steps, operations, units and/or components, and do not exclude the existence or addition of one or more other features, integers, steps, operations, units, components, and/or combinations thereof.

The present application will be further described below in conjunction with the figures and embodiments.

Figure 1:
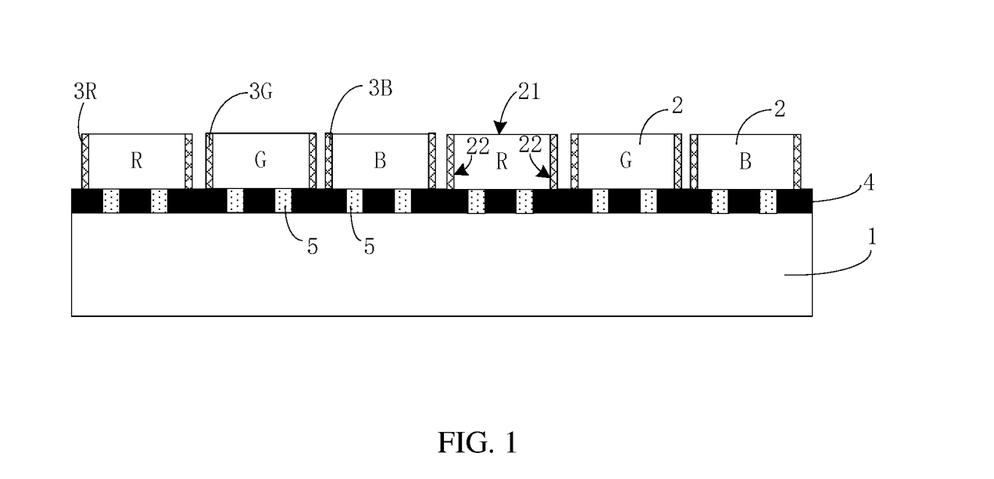
FIG. 1 is a schematic cross-sectional view of a display panel provided by one embodiment of the present application.

As shown in FIG. 1, one embodiment of the present application provides a display panel including an array substrate 1 and a plurality of light emitting devices 2 on the array substrate 1. The light emitting device 2 can be a mini-LED or a micro-LED, and a size of the light emitting device 2 is not limited. Each of light emitting device 2 includes an upper light emitting surface 21 and a side light emitting surface 22 configured to transmit light, that is, each light emitting device 2 can emit light through the upper light emitting surface 21 and the side light emitting surface 22. The upper light emitting surface 21 refers to a surface of the light emitting device 2 away from the array substrate 1, and the side light emitting surface 22 refers to four sides of the light emitting device 2 adjacent to the upper light emitting surface 21. That is, all surfaces other than the contact surface of the substrate 1 can be used as the light emitting surface to emit light.

A plurality of light emitting devices 2 are distributed on the array substrate 1 in an array, and the array substrate 1 may be a TFT substrate. The array substrate 1 includes a plurality of thin film transistors (not shown in the figure), and the plurality of thin film transistors are provided in a one-to-one correspondence with the plurality of light emitting devices 2, and there is a connection terminal 5 disposed between each thin film transistor and its corresponding light emitting device 2, as shown in FIG. 1, each thin film transistor is electrically connected to its corresponding light emitting device 2 through the connection terminal 5 for driving the corresponding light emitting device 2 to emit light.

Figure 2:
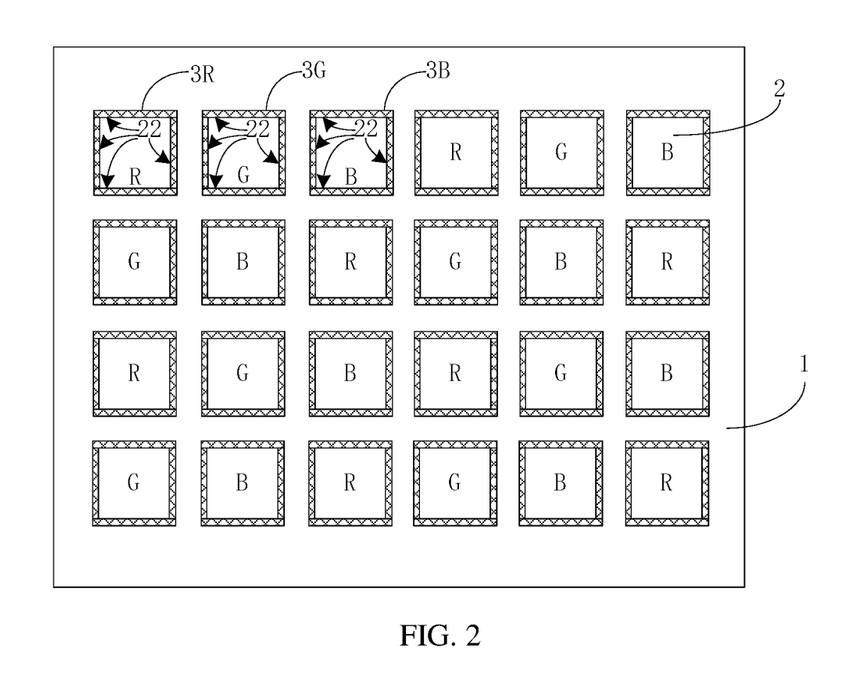
FIG. 2 is a schematic diagram of a first structure of the display panel provided by one embodiment of the present application.

The plurality of light emitting devices 2 includes a plurality of light emitting devices with different colors, and a number of light emitting devices of each color is several to ensure that the displayed image does not cast color. As shown in FIG. 2, the plurality of light emitting devices with different colors may include a red light emitting device R, a green light emitting device G, and a blue light emitting device B, that is, the plurality of light emitting devices 2 may include at least one red light emitting device R, at least one green light emitting device G, and at least one blue light emitting device B. The red light emitting device R refers to a light emitting device that can emit red light, the green light emitting device G refers to a light emitting device that can emit green light, and the blue light emitting device B refers to a light emitting device that can emit blue light.

Since the plurality of light emitting devices with different colors are mixed and distributed on the array substrate 1, and each light emitting device can emit light through the side light emitting surface, it is easy to cause light mixing between adjacent light emitting devices with different colors. Therefore, in the embodiment of the present application, the side light emitting surface 22 of each light emitting device 2 is provided a reflective layer 3, and the reflective layer 3 can be formed on the side light emitting surface 22 of the light emitting device 2 through a process such as chemical vapor deposition. The reflective layers 3 on the light emitting devices with different colors are different, and the reflective layer 3 on the light emitting devices with one color is configured to reflect the light emitted by the light emitting devices with another colors.

For example, the reflective layer 3R on the red light emitting device R is configured to reflect the light emitted by the green light emitting device G and the blue light emitting device B, that is, configured to reflect green light and blue light; the reflective layer 3G on the green light emitting device G is configured to reflect the light emitted by the red light emitting device R and the blue light emitting device B, that is, configured to reflect red light and blue light; the reflective layer 3B on the blue light emitting device B is configured to reflect the light emitted by the red light emitting device R and the green light emitting device G, that is, configured to reflect red light and green light.

In one embodiment, the reflective layer 3 on each light emitting device 2 completely covers the side light emitting surface 22 of the light emitting device 2. As shown in FIG. 2, the reflective layer 3R on the red light emitting device R completely covers the side light emitting surface 22 of the red light emitting device R, the reflective layer 3G of the green light emitting device G completely covers the side light emitting surface 22 of the green light emitting device G, and the reflective layer 3B on the blue light emitting device B completely covers the side light emitting surface 22 of the blue light emitting device B. In this case, for each light emitting device 2, no matter which side of the light emitting device 2 is provided with the light emitting devices with another colors, the reflective layer 3 on the light emitting device 2 can reflect the light emitted from the light emitting devices with another colors, to prevent color mixing between the light emitting device 2 and the light emitting devices with another colors. In addition, the reflective layer 3 on each light emitting device 2 completely covers the side light emitting surface of the light emitting device 2, which can ensure that the light of the light emitting device 2 is concentrated on the upper light emitting surface to emit light, and the light emitted by the light emitting device 2 is prevented from being too scattered.

Figure 3:
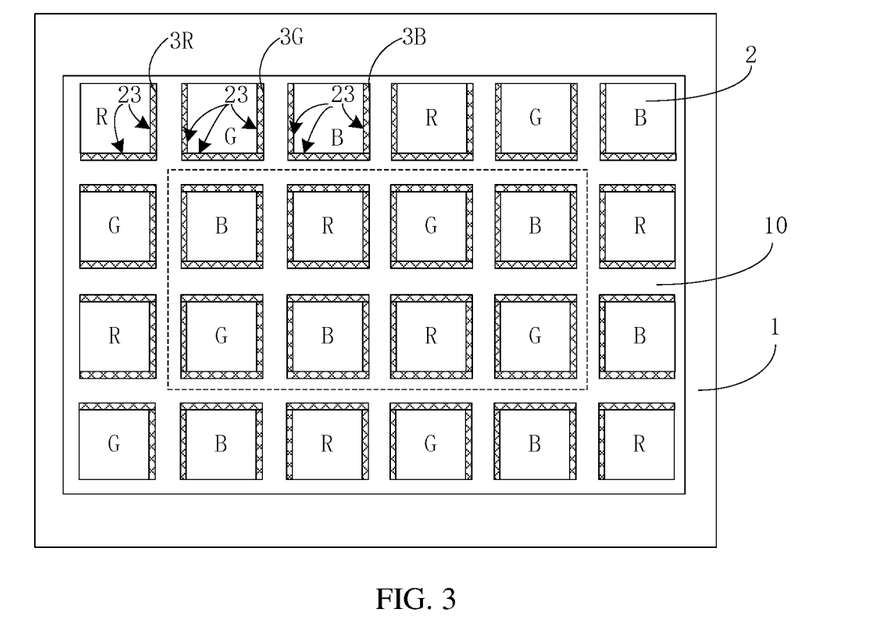
FIG. 3 is a schematic diagram of a second structure of the display panel provided by one embodiment of the present application.

In another embodiment, the side light emitting surface 22 of each light emitting device 2 includes at least one first sub-light-emitting surface 23 adjacent to other light emitting devices 2, and the reflective layer 3 is positioned on the at least one first sub-light-emitting surface 23. It is understandable that not every light emitting device 2 is surrounded by other light emitting devices. As shown in FIG. 3, in the edge area 10, the light emitting devices 2 has only two or three sides provided with other light emitting devices 2, that is, only two sides or three sides of the light emitting device 2 are provided adjacent to other light-emitting devices 2 in the edge area 10. By taking a side surface of the side light emitting surface 22 of the light emitting device 2 adjacent to other light emitting device 2 as the first sub-light-emitting surface 23, therefore the light emitting device 2 in the edge region 10 has two or three first-sub-light-emitting surfaces 23, other light emitting devices 2 in the non-edge area (other areas except the edge area 10) are surrounded by other the light emitting devices 2, so the light emitting devices 2 in the non-edge area has four first sub-light emitting surfaces 23.

Since the first sub-light-emitting surface 23 of the light emitting device 2 in the edge area 10 is adjacent to other light emitting devices 2, the light emitting device 2 in the edge area 10 may mix color with other light emitting devices 2 through the first sub-light-emitting surface 23, and other side surfaces which are not provided adjacent to other light-emitting devices 2, therefore color mixing with other light-emitting devices 2 will not occur through these side surfaces. Therefore, the light emitting device 2 in the edge region 10 may only cover the reflective layer 3 on a part of the side light emitting surface 22, that is, the reflective layer 3 can only cover the first sub-light-emitting surface 23 of the side light emitting surface 22. Since the four side surfaces of the light emitting device 2 in the non-edge area are all the first sub-light emitting surfaces 23, the reflective layer 3 on the light emitting device 2 in the non-edge area still needs to completely cover the side light emitting surface 22 thereof.

For example, one red light emitting device R in the upper left corner of FIG. 3 is positioned in the edge area 10, the red light emitting device R is provided with light-emitting devices 2 on only two sides (a green light emitting device G is distributed on the right side, and a red light emitting device R is distributed on the front side) That is, the red light emitting device R has only two first sub-light-emitting surfaces 23 arranged adjacent to other light emitting devices 2, so the reflective layer 3R on the red light emitting device R only needs to cover these two first sub-light-emitting surfaces 23. The green light-emitting device G on the right side of the red light emitter R has only three sides with light emitting devices 2 (one red light emitting device R on the left, one green light-emitting device G on the front side, and one blue light-emitting device B on the right.), that is, the green light-emitting device G has only three first sub-light-emitting surfaces 23 adjacent to other light-emitting devices 2, so the reflective layer 3G on the green light-emitting device G only needs to cover these three first sub-light-emitting surfaces 23.

Figure 4:
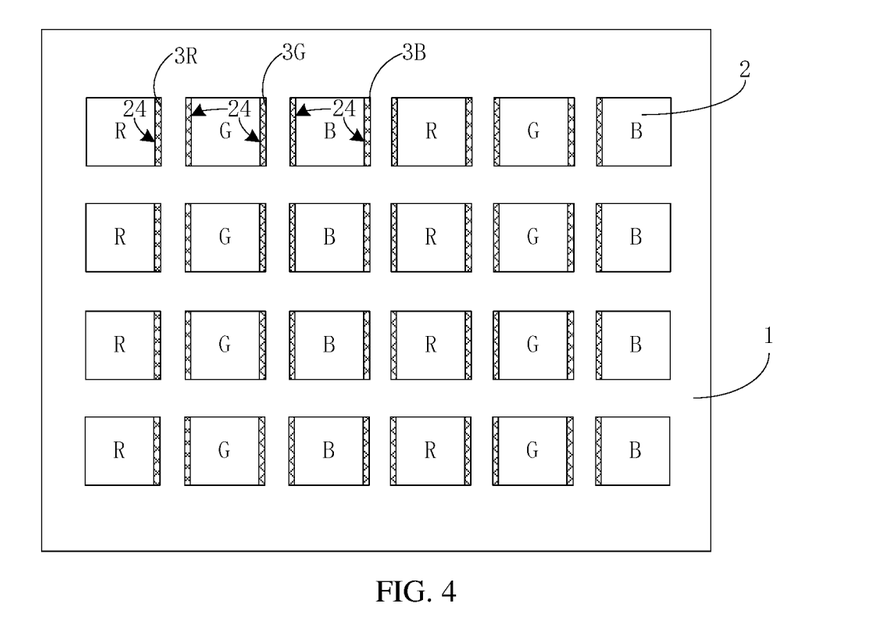
FIG. 4 is a schematic diagram of a third structure of the display panel provided by one embodiment of the present application.

In another embodiment, the side light emitting surface 22 of each light emitting device 2 includes at least one second sub-light-emitting surface 24 provided adjacent to the light emitting devices with another color, and the reflective layer 3 is provided on the at least one second sub-light-emitting surface 24. For each light emitting device 2, the light emitting devices with another color refer to light emitting devices of a different emitting color from the light emitting device. It is understandable that not every light emitting device 2 surrounded with the light emitting devices with another color, and each of the side surfaces of the side light emitting surface 22 of the light emitting device 2 adjacent to the light emitting devices with another colors are configured as the second sub-light-emitting surface 24. As shown in FIG. 4, the light emitting device 2 has only one side or two sides with the light emitting device with another color, that is, the light emitting device 2 has only one side or two sides adjacent to the light emitting devices with another colors, so the light emitting device 2 has one or two second sub-light-emitting surface 24. The light-emitting devices with different colors are distributed differently on the array substrate 1, and each light emitting device 2 has a different number of second sub-light emitting surfaces 24.

Since the second sub-light-emitting surface 24 of the light emitting device 2 is arranged adjacent to the light emitting device with another color, the light emitting device 2 will mix color with the light emitting device with another color through the second sub-light-emitting surface 24, and other side surfaces are not provided adjacent to the light emitting device with another color, and will not color mix with the light emitting devices with another colors through the other side surfaces. Therefore, the reflective layer 3 on the light emitting device 2 may only cover a part of the side light emitting surface 22, that is, the reflective layer 3 only cover the second sub-light-emitting surface 24 of the side light emitting surface 22.

For example, the red light emitting device R in the upper left corner of FIG. 4 has only one side around with the light emitting device with another color (a green light emitting device G is provided on the right), that is, the red light emitting device R has only one second sub-light-emitting surface 24 adjacent to the light emitting device with another color, so the reflective layer 3R on the red light emitting device R only needs to cover this one second sub-light emitting surface 24. The green light-emitting device G on the right side of the red light emitting device R has only two sides provided with the light emitting devices 2 with another colors (a red light emitting device R is distributed on the left side, and a blue light-emitting device B is distributed on the right side), that is, the green light emitting device G has only two second sub-light-emitting surfaces 24 arranged adjacent to the light emitting devices with another colors, so the reflective layer 3G provided on the green light emitting device G only needs to cover these two second sub-light-emitting surfaces 24.

Figure 5:
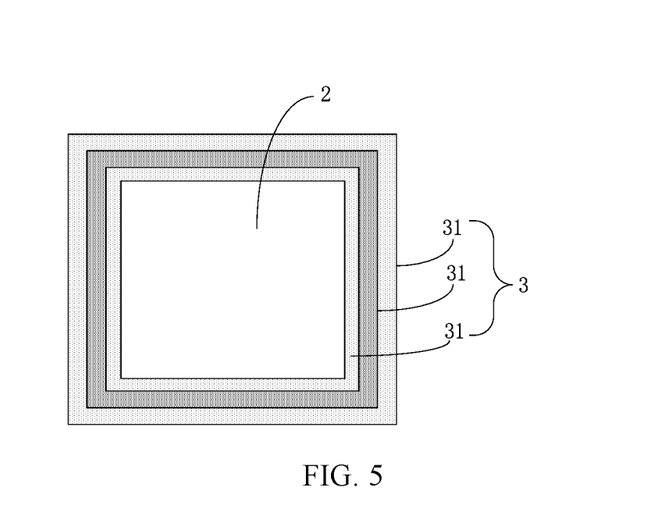
FIG. 5 is a schematic diagram of a first structure of a reflective layer in the display panel provided by one embodiment of the present application.

Different colors of light have different wavelengths. By providing different material and thickness of the reflective layer 3 on each color light emitting device, the reflective layer 3 on each color light emitting device can reflect light in a fixed wavelength band, in this way, the light emitted by the light emitting devices of other colors can be reflected. As shown in FIG. 5, the reflective layer 3 on each color light emitting device may include a plurality of reflective films 31 laminated on the side light emitting surface 22, and the refraction indexes of any two adjacent reflective films 31 are different. The refractive index of the reflective films 31 arranged at intervals may be the same. For example, in the reflective layer 3, the refractive indexes of the first reflective film and the third reflective film are the same, the refractive indexes of the second reflective film and the fourth reflective film are the same, and the refractive index of the first reflective film is different from the refractive index of the second reflective film; or, the refractive indexes of the plurality of reflective film 31 in the reflective layer 3 are different, for example, the refractive indexes of the first reflective film, the second reflective film, the third reflective film, and the forth reflective film are different. Since the refractive index is related to the material, the materials of any two adjacent reflective films 31 in the reflective layer 3 are different, and the materials of the reflective films 31 arranged at intervals may be the same or different. Each reflective film 31 may include any one of semiconductor materials such as silicon nitride SiNx, silicon oxide SiOx, and amorphous silicon a-Si. For example, the reflective layer 3 may be a SiNx/SiOx/SiNx multilayer reflective film structure, or the reflective layer 3 can be a SiNx/a-Si/SiNx multilayer reflective film structure, etc., and the reflective layer 3 can also be other types of multilayer reflective film structures, as long as it can reflect light in a fixed wavelength band, which is not specifically limited here.

Figure 6:
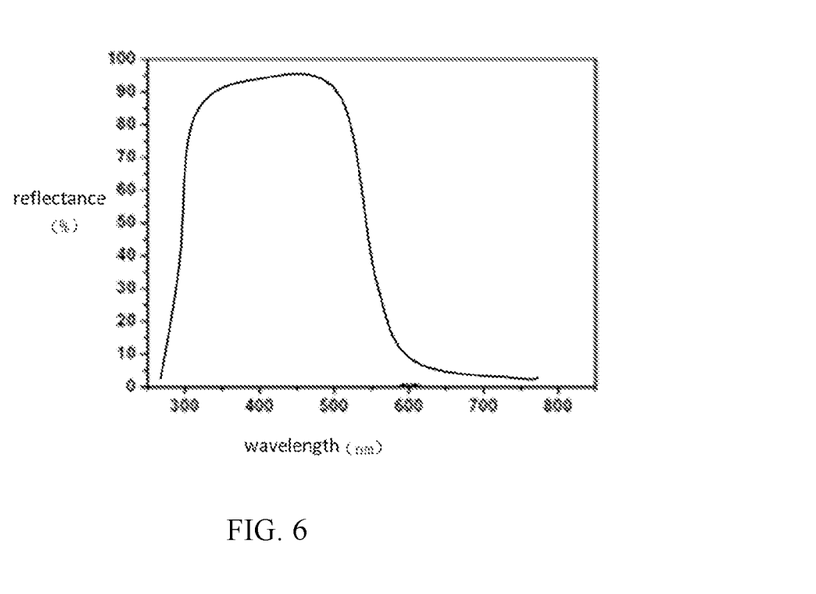
FIG. 6 is a schematic diagram of a relationship between a wavelength and a reflectance corresponding to the reflective layer on a red light emitting device in the display panel provided by one embodiment of the present application.
Figure 7:
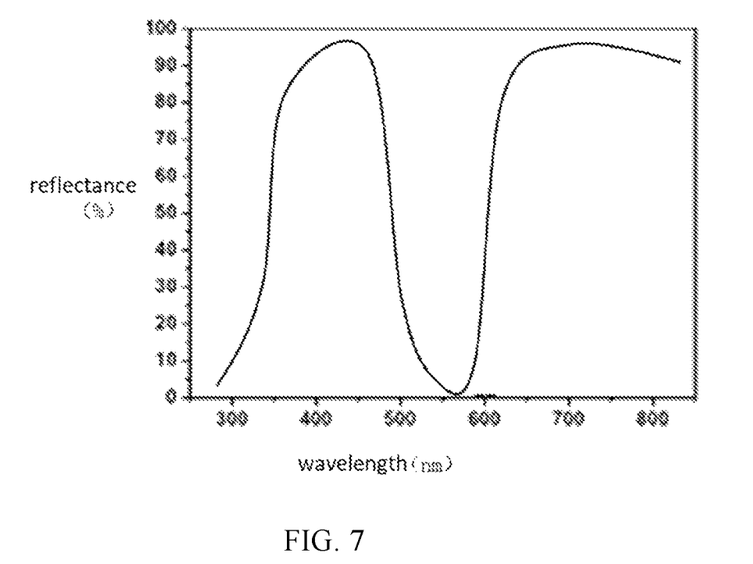
FIG. 7 is a schematic diagram of a relationship between a wavelength and the reflectance corresponding to the reflective layer on a green light emitting device in the display panel provided by the embodiment of the present application.
Figure 8:
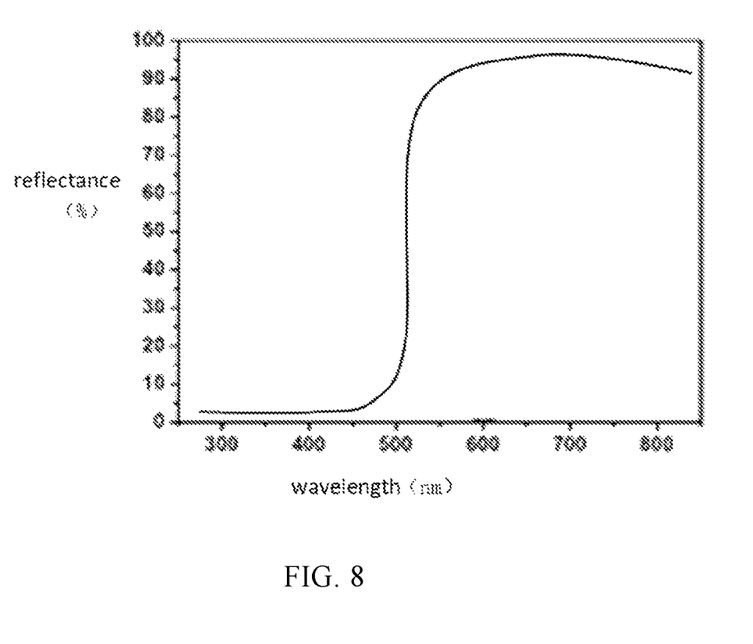
FIG. 8 is a schematic diagram of a relationship between a wavelength and a reflectance corresponding to the reflective layer on a blue light emitting device in the display panel provided by one embodiment of the present application.

A material, a thickness, and a number of reflective films of the reflective layer on the light emitting devices with different colors are different, and the material, thickness, and number of reflective layers of the reflective layer 3 on the same color light-emitting device can be the same. Referring to FIG. 6, FIG. 6 is a schematic diagram of a relationship between a wavelength and a reflectance corresponding to the reflective layer on the red light emitting device in the display panel provided by one embodiment of the present application. It can be seen that the reflection of the blue and green light bands is relatively high, that is, the reflective layer 3R can reflect the light in the blue and green light bands. Referring to FIG. 7, FIG. 7 is a schematic diagram of a relationship between a wavelength and the reflectance corresponding to the reflective layer on the green light emitting device in the display panel provided by the embodiment of the present application. It can be seen that the reflection of blue and red light is relatively high, that is, the reflective layer 3G can reflect light in the blue and red light band. Referring to FIG. 8, FIG. 8 is a schematic diagram of a relationship between a wavelength and a reflectance corresponding to the reflective layer on the blue light emitting device in the display panel provided by one embodiment of the present application. It can be seen that the reflection of the green light and the red light corresponding to the wavelength band is relatively high, that is, the reflective layer 3B can reflect light in the band of green and red light.

Figure 9:
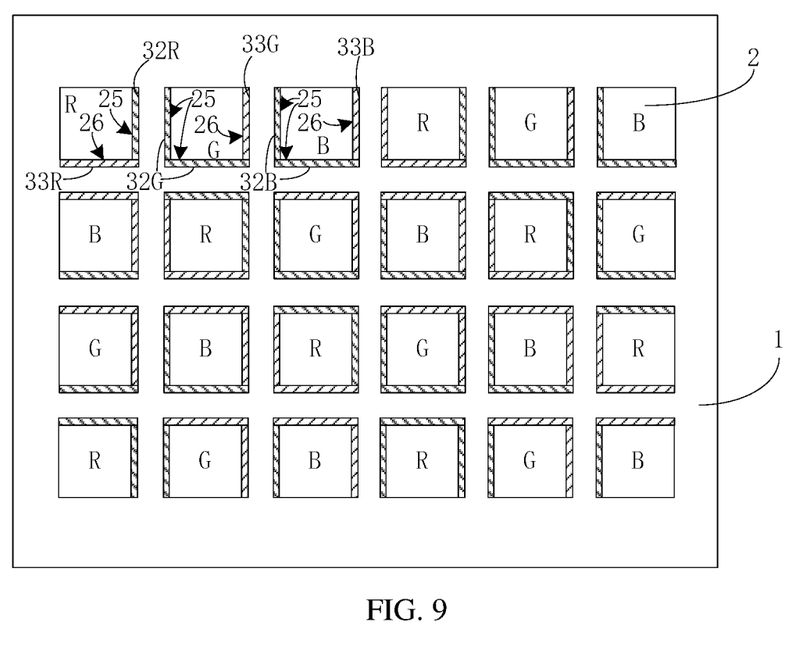
FIG. 9 is a schematic diagram of a fourth structure of a display panel provided by one embodiment of the present application.

When the reflective layer 3 on the light emitting device 2 covers the side surface adjacent to other color light emitting devices in the side light emitting surface 22, the reflective layer 3 on the side surface adjacent to the different color light emitting device may be the same, as shown in FIGS. 4 and 5, the reflective layer 3 on the side adjacent to the light emitting devices with different colors may also be different, as shown in FIG. 9.

For example, the plurality of light emitting devices may be three color light emitting devices, and the side light emitting surface 22 of each color light emitting device may include a third sub-light-emitting surface 25 and a fourth sub-light-emitting surface 26 respectively arranged adjacent to the other two color light emitting devices. The structure of the reflective layer 3 covering the third sub-light-emitting surface 25 and the fourth sub-light-emitting surface 26 may be different, that is, the reflective layer 3 may include a first-sub-reflective layer 32 covering the third light emitting surface 25 and a second sub-reflective layer 33 covering the fourth sub-light-emitting surface 26. The first-sub-reflective layer 32 is configured to reflect the light emitted by the light emitting device with other color provided adjacent to the third sub-light-emitting surface 25, and the second-sub-reflective layer 33 is configured to reflect the light emitted by other light-emitting device with another color provided adjacent to the fourth sub-light-emitting surface 26.

Specifically, the plurality of light-emitting device includes a first color light emitting device, a second color light emitting device, and a third color light emitting device, wherein the first color light emitting device, the second color light emitting device, and the third color light emitting device may be a red light emitting device R, a green light emitting device G, and a blue light emitting device B, respectively.

A side light emitting surface 22 of the red light emitting device R may include at least one third sub-light-emitting surface 25 adjacent to the green light-emitting device G, and at least one fourth sub-light-emitting surface 26 adjacent to the blue light-emitting device B. The reflective layer 3R on the red light emitting device R includes a first sub-reflective layer 32R and a second sub-reflective layer 33R. The first sub-reflective layer 32R covers at least one third sub-light-emitting surface 25 for reflecting green light emitted by the green light-emitting device G. The second sub-reflective layer 33R covers at least one fourth sub-light-emitting surface 26 configured for reflecting the blue light emitted by the blue light-emitting device B.

Similarly, the side light emitting surface 22 of the green light-emitting device G may include at least one third sub-light-emitting surface 25 adjacent to the red light emitting device R, and at least one fourth light-emitting surface 26 adjacent to the blue light-emitting device B. The reflective layer 3G on the green light-emitting device G includes a first sub-reflective layer 32G and a second sub-reflective layer 33G, the first sub-reflective layer 32G covers at least one third sub-light-emitting surface 25 for reflecting the red light emitted by the red light emitting device R, the second sub-reflective layer 33G covers at least one fourth sub-light-emitting surface 26 for reflecting the blue light emitted by the blue light-emitting device B.

The side light emitting surface 22 of the blue light-emitting device B may include at least one third sub-light-emitting surface 25 adjacent to the green light-emitting device G, and at least one fourth sub-light-emitting surface 26 adjacent to the red light emitting device R. The reflective layer 3B on the blue light-emitting device B includes a first sub-reflective layer 32B and a second sub-reflective layer 33B. The first sub-reflective layer 32B covers at least one third sub-light-emitting surface 25 for reflecting the green light emitted by the green light-emitting device G, the second sub-reflective layer 33B covers at least one fourth sub-light-emitting surface 26 for reflecting the red light emitted by the red light emitting device R.

It should be noted that the light emitting device 2 can also be provided adjacent to the light-emitting devices with only one color, that is, the light emitting device 2 only has the third sub-light-emitting surface 25 or the fourth sub-light-emitting surface 26, so the light emitting device 2 can only have the first sub-reflective layer 32 or the second sub-reflective layer 33. As shown in FIG. 9, the blue light emitting device B in the upper right corner is only adjacent to the green light emitting device G (the left side and the front side are both green light-emitting devices G), that is, the blue light emitting device B only has two third sub-light-emitting surface 25, therefore, the blue light emitting device B may only be provided with the first sub-reflective layer 32 for reflecting the green light emitted by the adjacent green light emitting device G.

The first sub-reflective layer 32 and the second sub-reflective layer 33 on each color light-emitting device reflect different colors, and the wavelength bands of the different colors are different, so by providing the first sub-reflective layer 32 and the second sub-reflective layer 32 on each color light-emitting device, the material and thickness of the second sub-reflective layer 33 can enable the first sub-reflective layer 32 and the second sub-reflective layer 33 on each color light-emitting device to reflect light of a fixed wavelength band, respectively.

Figure 10:
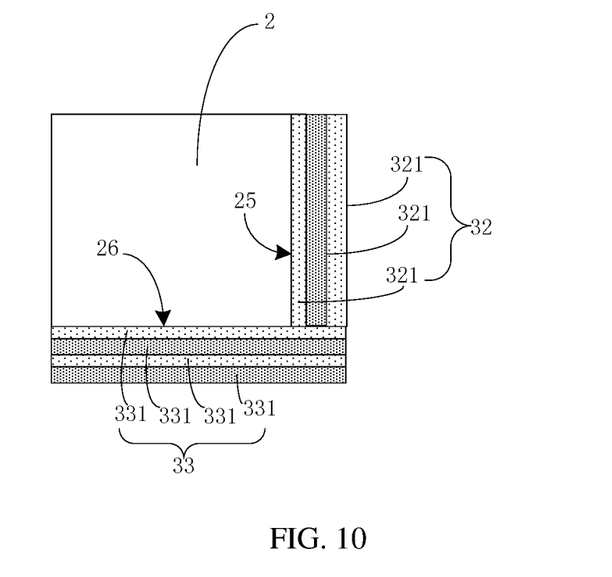
FIG. 10 is a schematic diagram of a second structure of the reflective layer in the display panel provided by one embodiment of the present application.

As shown in FIG. 10, for each color light-emitting device, the first sub-reflective layer 32 may include a plurality of first sub-reflective film 321 laminated on the third sub-light-emitting surface 25, and refractive indexes of any two adjacent first sub-reflective films 321 of the plurality of the first sub-reflective layer 32 are different, and the refractive indexes of the first sub-reflective films 321 arranged at intervals may be the same or different. Since the refractive index is related to the material, the materials of any two adjacent first sub-reflective films 321 in the first sub-reflective layer 32 are different, and the materials of the first sub-reflective films 321 arranged at intervals may be the same or different. Each layer of the first sub-reflective film 321 may include any one of semiconductor materials such as silicon nitride SiNx, silicon oxide SiOx, and amorphous silicon a-Si. For example, the first sub-reflective layer 32 may be a SiNx/SiOx/SiNx. multilayer first sub-reflective film structure, or may be a SiNx/a-Si/SiNx multilayer first sub-reflective film structure, etc., the first sub-reflective layer 32 may also be other types of multilayer first sub-reflective film structures, as long as it can reflect light of a fixed wavelength band, it is not specifically limited here.

The second sub-reflective layer 33 may include a plurality of second sub-reflective film 331 laminated on the fourth sub-light emitting surface 26, and refractive indexes of any two adjacent second sub-reflective films 331 of the plurality of second sub-reflective layer 33 are different, and the refractive indexes of the second sub-reflective film 331 arranged at intervals may be the same or different. Since the refractive index is related to the material, the materials of any two adjacent second sub-reflective films 331 in the second sub-reflective layer 33 are different, and the materials of the second sub-reflective films 331 arranged at intervals may be the same or different. Each layer of the second sub-reflective film 331 may include any one of semiconductor materials such as silicon nitride SiNx, silicon oxide SiOx, and amorphous silicon a-Si. For example, the second sub-reflective layer 33 may be a SiNx/SiOx/SiNx multilayer second sub-reflective film structure, or may be a SiNx/a-Si/SiNx multilayer second sub-reflective film structure, etc., the second sub-reflective layer 33 can also be other types of multilayer second sub-reflective film structure, as long as it can reflect light of a fixed wavelength band, and it is not specifically limited here.

For each color light-emitting device, the material, thickness, and number of sub-reflective films of the first sub-reflective layer 32 and the second sub-reflective layer 33 may be different. For light emitting devices with different colors, the material and thickness of the sub-reflective layer reflecting the same color of light and the number of layers of the sub-reflective film can be the same. As shown in FIG. 9, the first sub-reflective layer 32R on the red light emitting device R is completely the same as the first sub-reflective layer 32B on the blue light-emitting device B, and is configured to reflect green light. The second sub-reflective layer 33R on the red light emitting device R is completely the same as the second sub-reflective layer 33G on the green light-emitting device G, and is configured to reflect blue light. The first sub-reflective layer 32G on the green light-emitting device G is completely the same as the second sub-reflective layer 33B on the blue light-emitting device B, and is configured to reflect red light.

Further, the display panel further includes a plurality of light shielding layers 4, a plurality of light emitting devices 2 are distributed on the array substrate 1 at intervals, and the plurality of light shielding layer 4 are positioned on the array substrate 1 between any adjacent light emitting devices of two colors, as shown in FIG. 1. The light shielding layer 4 may also be positioned in any area on the array substrate 1 except for the connection terminal where the light emitting device 2 is electrically connected to the array substrate 1. By providing the light shielding layer 4, light mixing between adjacent light-emitting devices of different colors can be further prevent, and the display effect can be improved, wherein the light shielding layer 4 may be a black light-absorbing material, for example, the light shielding layer 4 may be ink or the like.

It should be noted that under the condition that the process can be realized, the plurality of light emitting devices 2 distributed on the array substrate 1 can also be provided without spacing, that is, the plurality of light emitting devices 2 are provided in close contact with each other, so as to ensure a difference between adjacent ones. The light emitting devices with different colors do not cause light mixing, and at the same time, the occupied space of the plurality of light emitting devices 2 is reduced.

In summary, the display panel in the embodiment of the present application includes a plurality of light emitting devices 2 distributed in an array. Each light emitting device 2 includes an upper light emitting surface 21 and a side light emitting surface 22, and the side light emitting surface of each light emitting device 2 is provided with a reflective layer 3, the plurality of light emitting devices 2 include a plurality of light emitting devices with different colors, and the reflective layer 3 on the light emitting device with one color is configured to reflect the light emitted by the color light emitting device with another colors to prevent light mixing of adjacent light emitting devices with different colors, to improve the display effect.

In summary, although the present application has been disclosed as above in preferred embodiments, the above preferred embodiments are not intended to limit the present application. Those of ordinary skill in the art can make various changes and modifications without departing from the spirit and scope of the present application. Therefore, a protection scope of the present application is subject to the scope defined by the claims.

What is claimed is:

1. A display panel, comprising:
a plurality of light emitting devices distributed in an array, wherein each light emitting device comprises an upper light emitting surface and a side light emitting surface configured to transmit light, and wherein the side light emitting surface is provided with a reflective layer;
wherein the plurality of light emitting devices comprises a plurality of light emitting devices with different colors, and wherein the reflective layer on each light emitting device of the plurality of light emitting devices with the different colors having one color of the different colors is configured to reflect light emitted by another light emitting device of the plurality of light emitting devices with the different colors having another color of the different colors different from the one color of the different colors;
wherein the reflective layer comprises a plurality of reflective films laminated on the side light emitting surface; and
wherein refractive indexes of any two adjacent reflective films are different.

2. The display panel according to claim 1, wherein the side light emitting surface comprises at least one first sub-light-emitting surface provided adjacent to another light emitting device; and
the reflective layer is provided on the at least one first sub-light-emitting surface of the side light emitting surface.

3. The display panel according to claim 1, wherein the side light emitting surface comprises at least one second sub-light-emitting surface provided adjacent to the another light emitting device having the another color, and the reflective layer is provided on the at least one second sub-light-emitting surface of the side light emitting surface.

4. The display panel according to claim 1, wherein the refractive indexes of the plurality of reflective films are all different.

5. The display panel according to claim 1, wherein a material, a thickness, and a number of reflective films of the reflective layer on the plurality of light emitting devices with the different colors are different.

6. The display panel according to claim 1, wherein a material of each reflective film comprises any one of a silicon nitride, a silicon oxide, or an amorphous silicon.

7. The display panel according to claim 1, wherein the plurality of light emitting devices with the different colors comprises a first color light emitting device, a second color light emitting device, and a third color light emitting device;
a side light emitting surface of the first color light emitting device comprises at least one third sub-light-emitting surface and at least one fourth sub-light-emitting surface; and
the at least one third sub-light-emitting surface is provided adjacent to the second color light emitting device, and the at least one fourth sub-light-emitting surface is provided adjacent to the third color light emitting device.

8. The display panel according to claim 7, wherein the reflective layer on the first color light emitting device comprises a first sub-reflective layer and a second sub-reflective layer;
the first sub-reflective layer is provided on the at least one third sub-light-emitting surface, and is configured to reflect the light emitted from the second color light emitting device; and
the second sub-reflective layer is provided on the at least one fourth sub-light-emitting surface, and is configured to reflect the light emitted from the third color light emitting device.

9. The display panel according to claim 8, wherein the first sub-reflective layer comprises a plurality of first sub-reflective films laminated on the third sub-light-emitting surface, and the second sub-reflective layer comprises a plurality of second sub-reflective films laminated on the fourth sub-light-emitting surface; and
the refractive indexes of any two adjacent first sub-reflective films are different, and the refractive indexes of any two adjacent second sub-reflective films are different.

10. The display panel according to claim 9, wherein the refractive indexes of the plurality of first sub-reflective films are all different.

11. The display panel according to claim 9, wherein the refractive indexes of the plurality of second sub-reflective films are all different.

12. The display panel according to claim 9, wherein the first sub-reflective layer and the second sub-reflective layer are different in material, thickness, and number of sub-reflective films.

13. The display panel according to claim 1, further comprising:
an array substrate and a plurality of light shielding layers;
wherein the plurality of light emitting devices are positioned on the array substrate, and wherein the plurality of light shielding layers are positioned on the array substrate between any adjacent ones of the plurality of light emitting devices with the different colors.

14. The display panel according to claim 13, wherein a material of the light shielding layers is ink.

15. The display panel according to claim 1, wherein the plurality of light emitting devices with the different colors comprises a red light emitting device, a blue light emitting device, and a green light emitting device.

16. A display panel, comprising:
a plurality of light emitting devices distributed in an array, wherein each light emitting device comprises an upper light emitting surface and a side light emitting surface configured to transmit light, and wherein the side light emitting surface is provided with a reflective layer;
wherein:
the plurality of light emitting devices comprises a plurality of light emitting devices with different colors, and wherein the reflective layer on each light emitting device of the plurality of light emitting devices with the different colors having one color of the different colors is configured to reflect light emitted by another light emitting device of the plurality of light emitting devices with the different colors having another color of the different colors different from the one color of the different colors;
the plurality of light emitting devices with the different colors comprises a first color light emitting device, a second color light emitting device, and a third color light emitting device;
a side light emitting surface of the first color light emitting device comprises at least one third sub-light-emitting surface and at least one fourth sub-light-emitting surface;
the at least one third sub-light-emitting surface is provided adjacent to the second color light emitting device, and the at least one fourth sub-light-emitting surface is provided adjacent to the third color light emitting device;
the reflective layer on the first color light emitting device comprises a first sub-reflective layer and a second sub-reflective layer;
the first sub-reflective layer is provided on the at least one third sub-light-emitting surface, and is configured to reflect the light emitted from the second color light emitting device;
the second sub-reflective layer is provided on the at least one fourth sub-light-emitting surface, and is configured to reflect the light emitted from the third color light emitting device;
the first sub-reflective layer comprises a plurality of first sub-reflective films laminated on the third sub-light-emitting surface, and the second sub-reflective layer comprises a plurality of second sub-reflective films laminated on the fourth sub-light-emitting surface; and
the refractive indexes of any two adjacent first sub-reflective films are different, and the refractive indexes of any two adjacent second sub-reflective films are different.

17. A display panel, comprising:
a plurality of light emitting devices distributed in an array, wherein each light emitting device comprises an upper light emitting surface and a side light emitting surface configured to transmit light, and wherein the side light emitting surface is provided with a reflective layer; and
an array substrate and a plurality of light shielding layers;
wherein:
the plurality of light emitting devices comprises a plurality of light emitting devices with different colors, and wherein the reflective layer on each light emitting device of the plurality of light emitting devices with the different colors having one color of the different colors is configured to reflect light emitted by another light emitting device of the plurality of light emitting devices with the different colors having another color of the different colors different from the one color of the different colors;
the plurality of light emitting devices are positioned on the array substrate, and wherein the plurality of light shielding layers are positioned on the array substrate between any adjacent ones of the plurality of light emitting devices with the different colors; and
a material of the light shielding layers is ink.

* * * * *